United States Patent
Ng et al.

(10) Patent No.: US 9,451,706 B1
(45) Date of Patent: Sep. 20, 2016

(54) PROTOCOL FOR ASSIGNING FEATURES AND TUNING RESOLUTION IN DIGITAL LITHOGRAPHY

(71) Applicant: Palo Alto Research Center Incorporated, Palo Alto, CA (US)

(72) Inventors: Tse Nga Ng, San Diego, CA (US); Ping Mei, San Jose, CA (US); Steven E. Ready, Los Altos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 14/873,568

(22) Filed: Oct. 2, 2015

(51) Int. Cl.
*H05K 3/12* (2006.01)
*B41M 5/00* (2006.01)
*H05K 3/00* (2006.01)
*B41J 2/00* (2006.01)
*B41J 2/04* (2006.01)

(52) U.S. Cl.
CPC .......... *H05K 3/1241* (2013.01); *B41M 5/0023* (2013.01); *H05K 3/125* (2013.01); *B41J 2/00* (2013.01); *B41J 2/04* (2013.01); *H05K 3/00* (2013.01)

(58) Field of Classification Search
None
See application file for complete search history.

(56) References Cited

U.S. PATENT DOCUMENTS

| | | | |
|---|---|---|---|
| 7,055,756 B2 | 6/2006 | Anderson et al. | |
| 7,559,619 B2 | 7/2009 | Ready et al. | |
| 2006/0159899 A1* | 7/2006 | Edwards | H05K 3/12 428/209 |
| 2007/0153302 A1* | 7/2007 | Lin | H01L 21/6715 358/1.4 |

* cited by examiner

*Primary Examiner* — Lisa M Solomon
(74) *Attorney, Agent, or Firm* — Fay Sharpe LLP

(57) ABSTRACT

A system and method is used to optimize print parameters in the printing of functional electronic materials and integrated objects. The method employs a grid pattern to determine drop spacing and further assigns priority to various features to be printed, separating features into layers to be printed. The most critical layers being printed with higher resolution and greater accuracy, the less critical layers being printed at lower resolution.

17 Claims, 4 Drawing Sheets

PROTOCOL FOR ASSIGNING FEATURES AND TUNING RESOLUTION IN DIGITAL LITHOGRAPHY

BACKGROUND

The present application is directed to digital lithography, and more particularly to improving the tuning and resolution of the same.

With existing commercial digital printers, a design pattern is laid out on a grid, and each grid point designated by the design is then covered with material from the digital printers. The printed material administered from the digital printers is deposited on the desired surface in the form of drops at each grid point. This procedure does not take into account the importance of gap spacing and edge smoothness, two parameters important when printing electronics, especially for interconnect printing. For example, a typical digital printer prints narrow gaps by increasing the grid resolution and increasing the number of drops of dispensing. When printing electronics in this manner, the added drops required to increase printing resolution can lead to bridged gaps between the printed lines, causing undesired electrical short circuits. Further, certain types of deposited drops are known to exhibit scalloped patterns at the edge of an intended smooth edge printed line. Other printing conditions of an intended smooth edge continuous line can result in linewidth bulging and/or break up along with coalescing with close neighboring lines that already exist, a natural result of the affinity of the printed material to be joined with itself or hydrophilic surfaces.

The present application is concerned with improvements in the existing printing systems and operations.

BRIEF DESCRIPTION

A system and method is used to optimize print parameters in the printing of functional electronic materials and integrated objects (the combining of different functional printed features with other materials to create an active object). The method employs an optimal drop spacing to a printed feature's grid pattern and further assigns priority to various features to be printed by separating features to be printed into separate layers. The most critical layers being printed with higher resolution and greater accuracy, the less critical layers being printed at lower resolution.

BRIEF DESCRIPTION OF THE DRAWINGS

The following is a brief description of the drawings which is provided for the purposes of illustrating one or more of the exemplary embodiments described herein and not for the purposes of limiting the same.

DETAILED DESCRIPTION

Figure 1:
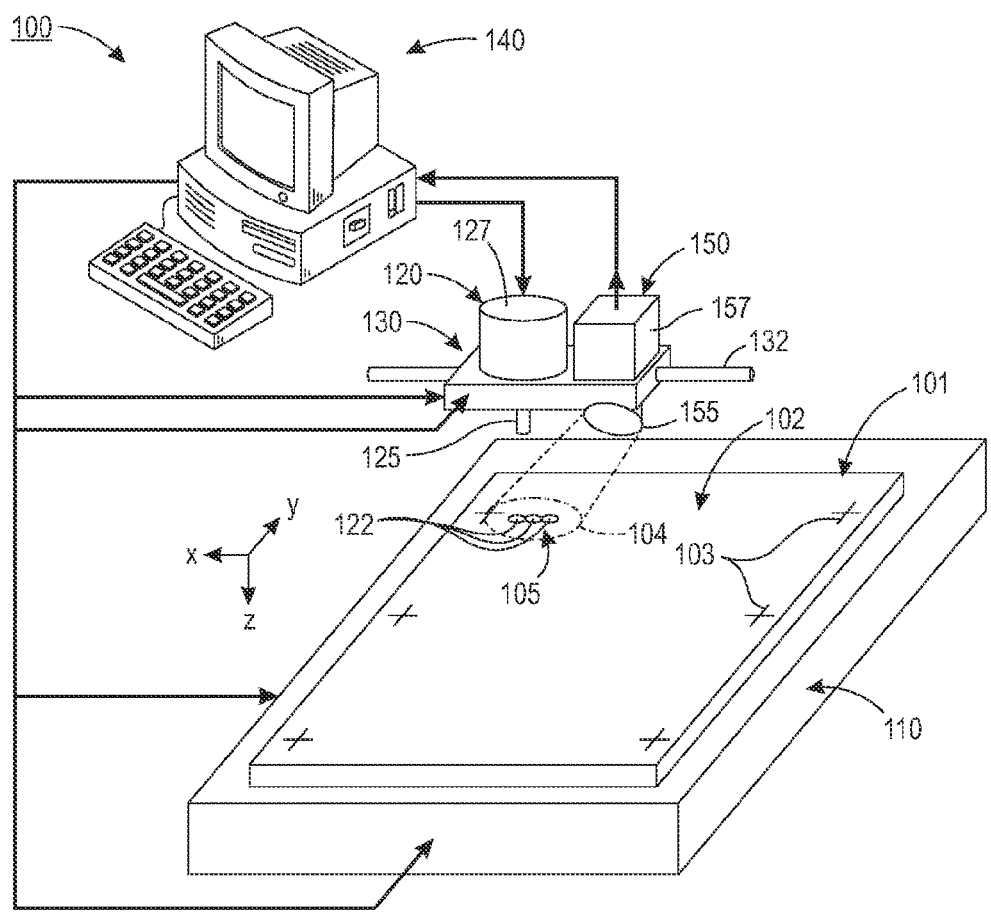
FIG. 1 is a partial perspective view showing a simplified digital lithography system used in accordance with the present teachings.

FIG. 1 illustrates a simplified digital lithography system 100 employed in an embodiment of the present application. Substrate 101 is placed or otherwise supported on a platen 110 below a drop source 120, which is suspended over platen 110 by way of a support structure 130. In a manner similar to conventional digital lithography systems, printing operations performed by drop source 120 are controlled by a digital control system 140 (e.g., a computer or other logic circuit programmed or otherwise configured to perform the various functions described herein). During these printing operations, drops 122 of appropriate material are ejected in the z-axis direction onto upper surface 102 of substrate 101 while substrate 101 and drop source 120 are moved relative to each other in the x-axis and/or y-axis directions, whereby printed features 105 are formed by contiguous drops 122 that are deposited and solidify on upper surface 102 of substrate 101.

Platen 110 and support structure 130 cooperatively form a positioning apparatus that is controlled by digital control system 140 to operably position drop source 120 relative to a selected region of substrate 101 during the printing process. In particular, digital control system 140 transmits positional commands to at least one of platen 110 and support structure 130, whereby drop source 120 is moved in the x-axis and y-axis directions until it is operably positioned over a predetermined substrate location (e.g., region 104) of substrate 101 for ejection of a drop. After a drop of an appropriate material is deposited on substrate 101, the relative positions of substrate 101 and drop source 120 are adjusted to reposition drop source 120 over a second position to print. The positioning and repositioning operations may be achieved either by moving drop source 120 or by moving substrate 101 via platen 110. In one embodiment, a motor moves support structure 130 along at least one rail 132 in a predetermined x-axis and/or y-axis direction pattern over substrate 101, thereby positioning drop source 120 over the predetermined substrate locations. Alternatively, or in addition, substrate 101 is positioned relative to drop source 120 by way of a motor and rail system (not shown) that moves platen 110 in the x-axis and/or y-axis directions. In addition, digital control system 140 transmits print (ejection) commands to drop source 120 such that the material drops 122 are selectively ejected onto predetermined substrate location 104 once the positioning operation is completed, thereby causing the selected drops 122 to form at least part of a printed feature 105 at the predetermined substrate location 104. By coordinating the movement of drop source 120 with the timing of drop source outputs, a printed feature is "printed" on substrate 101.

As indicated in FIG. 1, drop source 120 includes one or more print heads 125 for ejecting drops 122, a reservoir 127 for holding the material, and a conduit (not shown) for feeding the material from reservoir 127 to print head 125. Print head 125 includes a driver circuit that operates in response to the print commands received from digital control system 140 to eject drops 122 onto substrate 101

Drop source 120 may be implemented using a variety of technologies including traditional ink-jet technology (i.e., an ink-jet print head). An alternative technology well-suited for generating extremely small drop sizes is the use of sound waves to cause ejection of drops of masking material as done in acoustic ink printing systems. Another printing technology is vector type printing. It is understood that the system 100 of FIG. 1 is intended to represent these and other known printing systems and technologies.

Digital lithography system 100 further includes an imaging system 150, which functions to generate image data associated with selected regions of substrate 101 (e.g., printed feature 105 formed in predetermined substrate location 104), and to transmit this image data to digital control system 140 for real-time analysis. In one embodiment, imaging system 150 includes a digital camera having a lens 155 and image data generating circuitry 157 that are mounted on support platform 130 (i.e., fixedly connected to drop source 120 by way of rigid support platform 130).

The printing operation is then initiated by accessing print data and using the print data to position support structure 103 such that print head 125 is located over an initial predetermined substrate location 104.

When a digital lithography system (also called herein a digital printer, and inkjet printer) such as but not limited to that described above is used in the fabrication of two-dimensional and/or three-dimensional objects, such as active electronics and integrated objects, there is a need to adapt the printing path to maintain the desired printing resolution on a variety of different surfaces. Therefore disclosed herein, through various embodiments, are improved systems and methods designed to simplify the assignment of drop location and boundary hierarchies for printed matter. These improvements ensure that features of printed electronics and integrated objects considered of high value or critical are resolved, eliminating shortfalls such as shorting/open failures that can occur during traditional printing fabrication of for example electronics.

Figure 2:
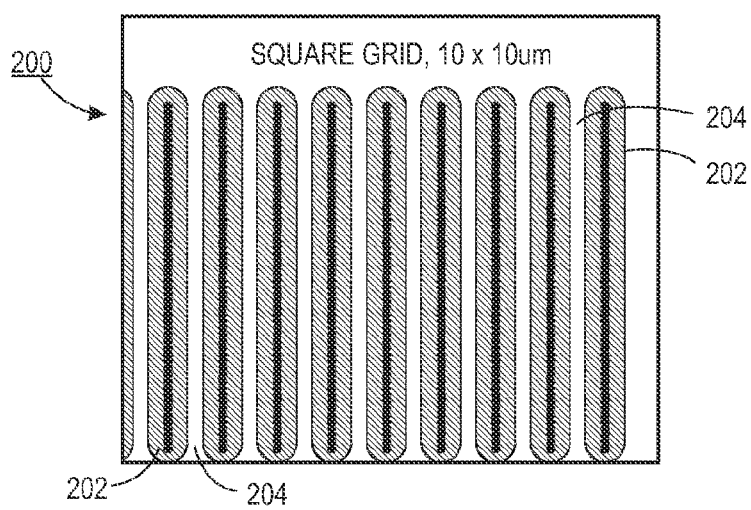
FIG. 2 is a square standard printing grid arrangement.

With reference to FIG. 2, illustrated is an exemplary grid arrangement 200 which depicts printed lines 202, and gaps 204 having standard grid spacing. This grid arrangement 200 is employed by existing standard digital printer processing operations. Grid 200 is understood to be a square grid as the spacing in the x-axis and y-axis is equal (e.g., 10×10 urn). To reiterate, this means that the distance from the center of each drop to each adjacent drop is 10 um.

With reference to square grid 200, a typical manner to print narrow gaps is to increase grid resolution; however, this in turn adds more drops often leading to gaps which short to other printed lines. Moreover in the square grid (e.g., 10×10 um) the drops can form scalloped patterns at an edge due to the affinity of the material used to form the drops to be pulled into neighboring lines already printed.

It is understood use of the square grid layout commonly does not result in a printed component that sufficiently corresponds to the digitized version of that component, for reasons such as mentioned above. This is particularly true when active electronic components are being printed. Therefore, in order to obtain printed features as close as possible to the desired layout, the grid pattern definition is refined herein by using non-square grid spacing to achieve optimal line widths, as shown for example in FIG. 3.

As is understood, by placing drops closer together total ink volume in the line increases, leading to a wider line. In the present embodiment grid spacing in the printing direction (y-axis) is varied in order to alter line widths, while grid spacing perpendicular to the printing direction (x-axis) is fixed, to allow fine resolution printing, forming the desired gap distance between printed lines.

This gap distance has particular usefulness when defining active electronic components, such as a transistor channel gap, as well as for printing fan-out lines for interconnects between components, among other implementations. In the instance of a transistor channel gap, the spacing defines the performance of the component, and thus it is beneficial to maintain proper spacing when printing for this use.

Figure 3:
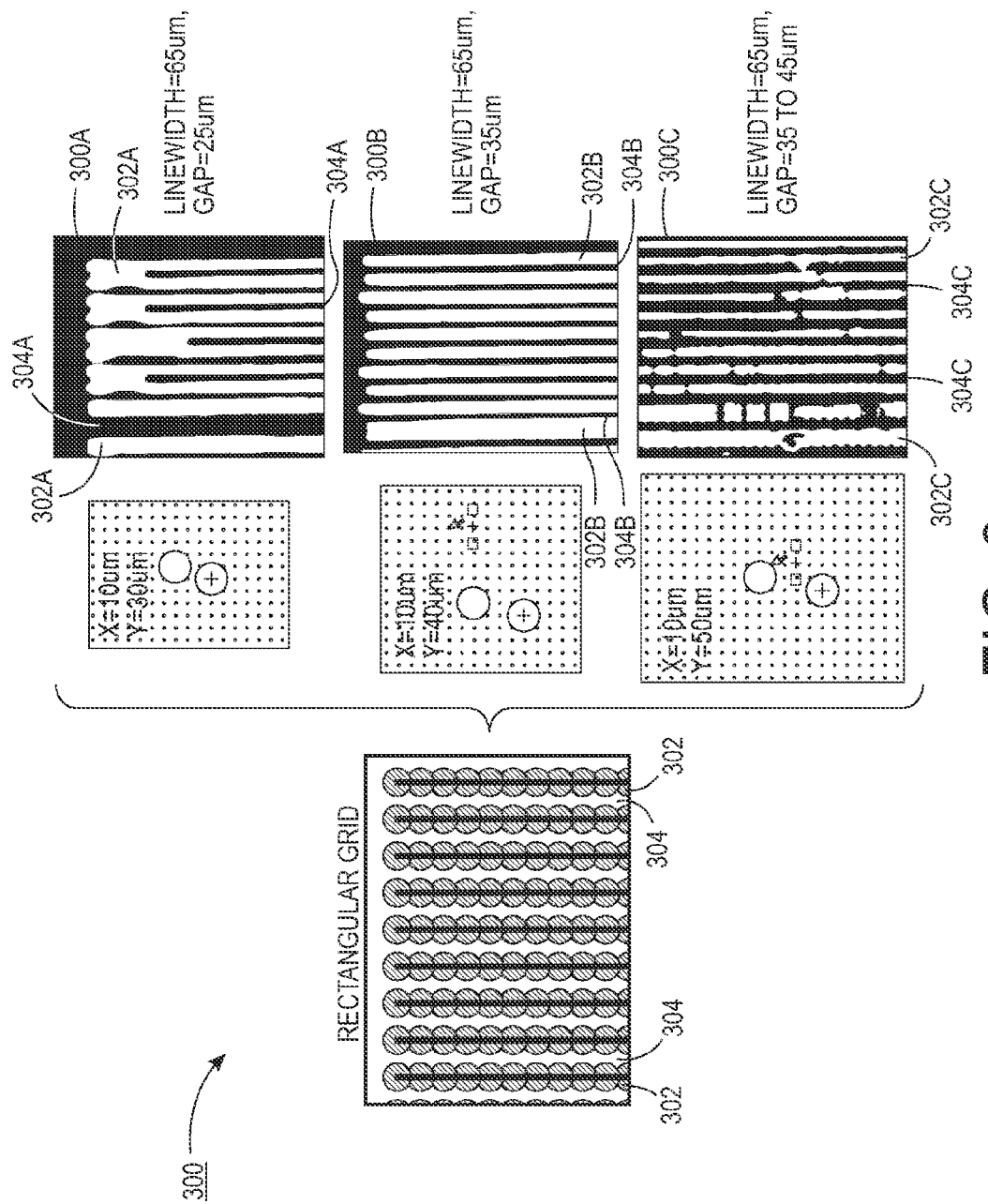
FIG. 3 is a non-square printing grid arrangement and illustrations of the effect of grid spacing on printed lines widths and gaps.

With continuing attention to FIG. 3 the non-square rectangular grid 300 includes printed lines 302, and gaps 304 positioned there between. Grid 300 is considered a non-square rectangular grid as the spacing in the x-axis and y-axis is not equal.

Depending on the resolution requirements for the desired print job, the layout pattern may be further separated into layers perpendicular to each other, such that the gaps are always patterned in the printing direction.

Resolutions requirements vary between 5 um and 100 um. Applications requiring "high" resolution are typically printed in the range of 5 um-30 um. Applications not requiring heightened resolution can be printed up to 100 um.

Variations in the y-direction and which alter line widths and gap spacing are depicted by illustrations 300a, 300b, and 300c, which are reproductions of photos of printed lines and gaps formed using the non-square rectangular grid concepts.

In 300a, 300b, 300c with printed lines 3002a, 3002b, 302c, and gaps 304a, 304b, 304c, grid spacing in the x-axis is fixed to allow fine resolution in gap formation in the x-axis. While a non-square rectangular grid arrangement is used in the present discussion, it is appreciated that other drop grid patterns may be employed, such as octagonal or other appropriate arrangement.

The effect of varying the starting grid spacing of 10 um in the x-direction and 10 um in the y-direction to 10 um in the x-direction and 30 um in the y-direction is illustrated in 300a. Mentioned measurements are taken from the center of each drop where it is placed on a desired substrate. The additional 20 um in the y-direction allows the drop to spread out further than would be expected in a square grid pattern. The resulting printed pattern of 300a has a line width of 75 um and a gap space of 25 um. There is bleeding of the drops into the adjacent lines, this bleeding can lead to open failures in printed electronics and is therefore not desirable.

The results of a further increase in the grid spacing parameters which keep the 10 um in the x-direction, and increases the y-direction to 40 um is shown in 300b. The resulting line width is 65 um with gap spacing of 35 um. By adding an additional 30 um (from the original 10 um) of space in the y-direction, the drops are allowed to spread out even further than seen in 300a. These parameters produce lines that are clear all the way through with near uniform spacing in between. For certain implementations such as printed electronics applications this would be desirable.

Illustration 300c depicts the results of yet another increase in the grid spacing parameters, where the x-direction is maintained at 10 um, and there is an increase to 50 um in the y-direction. The resulting line width for this modification is 65 um. The resulting gap spacing is in the range of 35-45 um. As can be seen in 300c at these parameters the lines can start to break up, destroying the continuity that is required for quality printed electronics.

It is appreciated that the drop accuracy depends on a number of factors, including but not limited to the digital lithographic system, the drop material (such as, ink, metal, nanoparticles, polymeric materials, among others), and the substrate to be printed (such as paper, plastic, metal or other substrates with appropriate surface energy.)

In the exemplary embodiments of the present application, the printing path is configured to emphasize edge integrity and line continuity. To achieve these improvements, the desired print pattern boundary is isolated and identified as a separate layer to be printed with high-resolution and optimized grid spacing. Once identified as a critical layer, the digital printer adjusts parameters relating to the grid spacing and print resolution. Optimal grid spacing varies depending on the layer and material being printed. The space between drops administered by the digital printer is varied by a percentage of drop size to increase or decrease the line width and gap space. For critical boundary layers, the drops can be spaced as close as 25% of the total drop diameter. This degree of drop spacing will translate to drops placed on top of one another at a greater rate. This increased overlap is intended to print a solid and contiguous line ideal for the most critical application layers.

For non-critical fill layers, sometimes referred to as "pads", the drops may be spaced as far apart as 90% of the total drop diameter. The pad layers are much less important than the boundary layers and therefore the need for increased resolution lessens.

After the critical layer has been printed, the area defined within the critical boundary layer can be printed with less stringent grid spacing and print resolution parameters, increasing the speed of the printing and saving valuable print material.

Figure 4:
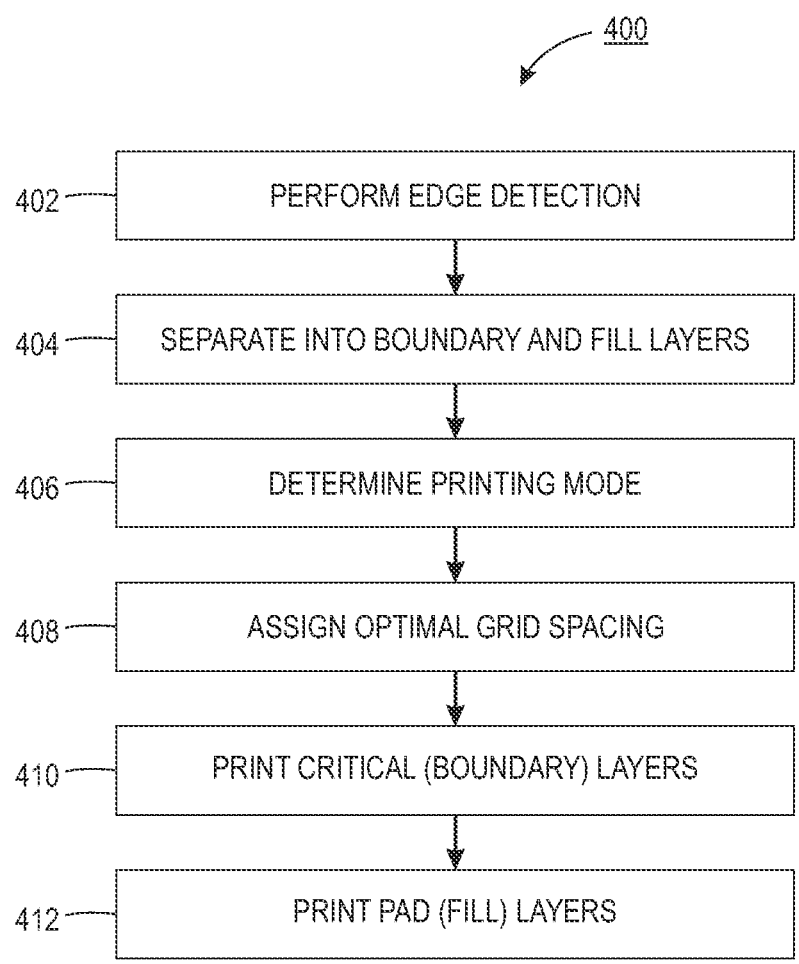
FIG. 4 is a flow chart for assigning features to be printed at different grid resolutions.

With reference to FIG. 4, a flow diagram 400 representative of the implementation of the exemplary embodiment is shown. The first step shown in the flow diagram is Perform Edge Detection 402. In one embodiment, edge detection may be accomplished through interaction with user input. The user inputs a design to be printed into design software that then sends the design to be printed to the printer. Edge detection software is well known in the art. Once the digital printer interprets the user input and identifies the edges of the item to be printed, the digital printer moves to the next step in flow diagram 400, Separate into Boundary and Fill layers 404, where the computer of the digital printer uses the edge detection information to identify boundary and fill locations of the item being printed.

In other embodiments the edge detection is automatically interpreted from the material to be printed.

In yet another embodiment, the printer can recognize that an error has been made in the edge detection and alert the user before valuable printing resources are spent.

In printed electronics applications, the boundary portions of the design to be printed are designated as critical layers. Some boundary layers are more critical than others. For example, the boundary that determines the channel length of a thin film transistor would be more critical than the boundary that determines the channel width. These two boundary layers would still both be considered critical layers, however print priority is given to the boundary that determines channel length. It is understood that the printer prints each layer separately.

Examples of non-boundary portions of the design to be printed are pad or fill layers. These layers are commonly printed after the critical layers. These non-critical layers can be printed with less resolution and thus greater gap space to allow the drops to disperse and fill in the layer. In certain embodiments the non-boundary layers are printed using a greater number of inkjet nozzles than boundary layers.

Once the digital printer has proper instructions as to the separate boundary and fill layers it then moves to the next step in the flow diagram 400, Determine Printing Mode 406. In one embodiment the printing mode is determined from a number of user inputs, including but not limited to, the print head being used, the type of material to be printed, and the substrate that will be printed on. Another parameter for determining grid spacing is the drop-surface (or ink-surface) contact angle, where the surface is the surface of the substrate material onto which the drops are being printed. Different printing modes will adjust for appropriate parameters adjusting for these variables.

After determining the proper print mode to use, the digital printer then determines the Optimal Grid Spacing 408. For critical boundary layers, optimal grid spacing will deposit the drops as close as the distance equal to 25% of the total drop diameter. This degree of drop spacing will translate to drops placed on top of one another at a greater rate. This increased overlap ensures a solid and contiguous line which is appropriate for the most critical application layers.

For non-critical fill layers, sometimes referred to as "pads", the drops may be spaced as far apart as 90% of the total drop diameter. The pad layers are less important than the boundary layers and therefore the need for increased resolution lessens.

After the Optimal Grid Spacing 408 is determined for the design to be printed, the digital printer then moves to a Print Critical Boundary Layers step 410. At this point the boundary layers are printed in accordance with the resolution and priority as assigned by the digital printer.

After the printer has printed the critical boundary layers, the printer then moves to a Print Fill or Pad Layers step 412. The fill layers will be printed at a lower resolution and priority as assigned by the digital printer.

The present steps which determine at least one critical layer and at least one non-critical layer include steps to separate layers. The steps to separate the layers further permit the obtaining or achieving the generation of gaps smaller than a diameter of a drop to be printed.

The printer envisioned implementing the flow diagram of FIG. 4 may be one such as the digital lithography system 100 described in FIG. 1 or any digital printer capable of printing functional electronic material. Certain embodiments may require digital printers capable of printing two-dimensional and/or three-dimensional functional electronic material. These types of printers being those used in systems for 3-D or additive manufacturing. Functional materials employable with the present concepts include but are not limited to conductive silver, copper, nickel, carbon inks, as well as semiconductor inks, such as oxide, organic polymers, among others.

Also, while the printing operation discussed herein has been an x-y type printing, other printing techniques may be used such as vector printing, which uses a single ejector of a print head, where the output of the single ejector adjusts its output dependent upon whether it is printing a boundary or fill layer. In this embodiment the arrangement of FIG. 1 is intended to be understood to be capable of vector type printing.

Figure 5:
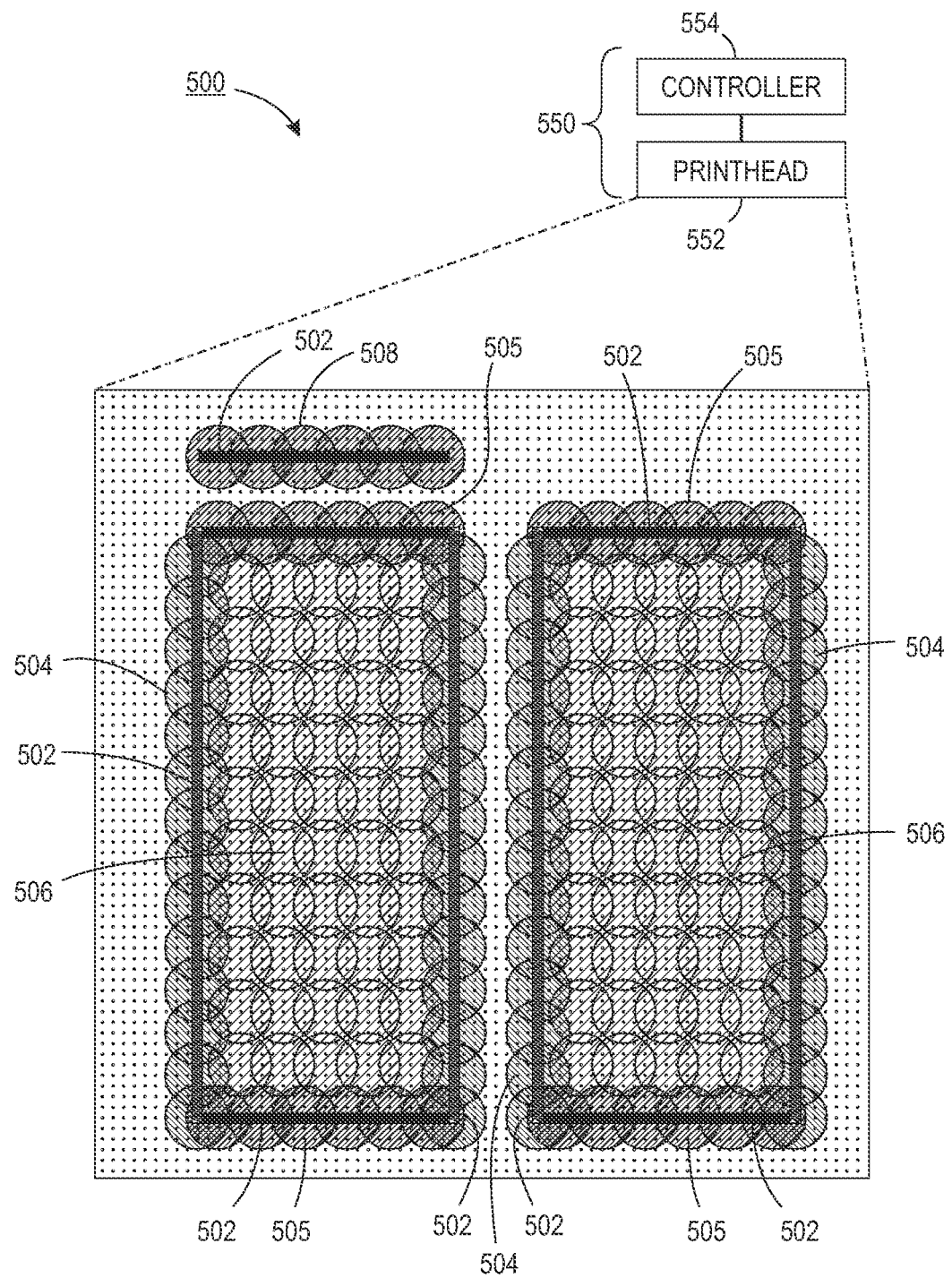
FIG. 5 is a representation of an exemplary layout pattern with separate critical boundary and non-critical fill layers.

With reference to FIG. 5, a representative printing pattern 500 is shown, and which is printed by a printer arrangement 550 having a printer device 552 and a controller 554 to control operation of the printer device 552 (controller 554 and printer 552 are shown separately, but of course may be integrated into a single unit or any other appropriate arrangement). Further, as mentioned above, the printer device 552 may be any of a number of different printers such as ink-jet (or jet) printer(s), acoustic printer(s), vector type printer(s), as well as lithographic type printer arrangement(s), appropriate for 2-D and/or 3-D type manufacturing.

The printer arrangement 550 defines a set of print lines 502. These lines may be identified within the controller (or may actually be printed) to assist the printer device 552 to accurately emit material in the form of drops, continuous layers, etc. A critical boundary layer formed of drops 504 is depicted on the perimeter of the print pattern area. The critical bounding layer 504 is in this embodiment printed first, with additional emphasis being placed on the continuity of the printed lines. In certain embodiments the critical layers are printed using a single nozzle (or nozzle jet) of the digital printer among others. Second level boundary drops 505, in this embodiment, are formed next. Use of a single nozzle increases the accuracy of the desired print area, but adds to the total print time. A non-critical fill layer 506 is shown enclosed by the boundary layers 504. Additional components can be attached to the printed circuit area via a bus 508. The bus 508 can be used as an interconnect for other components.

Gap spacing has particular applicability when printing thin film transistors (TFT). An improvement in the accuracy by which the gap spacing is tuned has a direct impact on the TFT functionality on the printed matter. Finely tuning the gap spacing alters the channel length of the TFT, an important characteristic of the TFT.

In another embodiment, the number of ejectors (e.g., nozzle jets) used by the printer can be varied depending on the desired print area. For critical boundary lines, single nozzle printing can be beneficial in order to clearly define the area. For non-critical pad areas, multiple nozzles (or nozzle jets) can be used to increase the speed of the print job and limit the output of material.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A method for optimizing placement of printed material for fabrication of an electronic component, the method comprising the steps of:
    determining an electronically functional material to be printed;
    generating a grid pattern to determine a space between drops of the electronically functional material to be deposited from a printer in a form of the grid pattern;
    defining at least one critical layer of the grid pattern requiring a defined printing resolution;
    defining at least one non-critical layer of the grid pattern, having a defined printing resolution lower than that for the at least one critical layer;
    printing the at least one critical layer; and
    printing the at least one non-critical layer.

2. The method according to claim 1 wherein the determining of the grid pattern includes adjusting the grid pattern to vary drop spacing to achieve desired line widths and gaps.

3. The method according to claim 1 further including using a drop-surface contact angle for determining grid pattern spacing.

4. The method according to claim 1 wherein the determining of the at least one critical layer and the at least one non-critical layer includes steps to separate layers for forming gaps smaller than a diameter of a print drop.

5. The method according to claim 1 further comprising the step of:
    using a single nozzle of the printer to print the at least one critical layer.

6. The method according to claim 1 further comprising the step of:
    using a multiple nozzle of the printer to print the at least one non-critical layer.

7. The method according to claim 1 further comprising the step of:
    determining grid pattern spacing from user input.

8. The method according to claim 1 wherein the print resolution of the critical layer is in the range of 5 um to 10 um.

9. The method according to claim 1 wherein the grid pattern has a spacing that is non-square.

10. The method according to claim 1 wherein the grid pattern has a spacing that is 10 um in the X direction and 30 um in the Y direction.

11. A system for improving assignment of drop location and boundary hierarchies in printing of electronics, the system comprising:
    a printer configured to operate based on a predetermined operation program;
    a user input configuration to input and specify a design to be printed;
    a communication mechanism to translate the user input into parameters for the printer to print;
    the printer configured to carry out the steps of:
        determining an electronically functional material to be printed;
        generating a grid pattern to determine a space between drops of the electronically functional material to be deposited from a printer in a form of the grid pattern;
        defining at least one critical layer of the grid pattern requiring a defined printing resolution;
        defining at least one non-critical layer of the grid pattern, having a defined printing resolution lower than that for the at least one critical layer;
        printing the at least one critical layer; and
        printing the at least one non-critical layer.

12. The system according to claim 11 wherein the printer is a digital inkjet printer capable of printing both two-dimensional and three-dimensional objects.

13. The system according to claim 12 wherein the printer is configured to combine single and multiple nozzle jetting paths to ensure a clear defined edge and high speed printing.

14. The system according to claim 11 further comprising:
    a user input area configured to receive user input to determine grid pattern spacing.

15. The system according to claim 11 wherein the print resolution of the critical layer is in the range of 5 um to 10 um.

16. The system according to claim 11 wherein the grid pattern has a spacing that is non-square.

17. The system according to claim 11 wherein the grid pattern has a spacing that is 10 um in the X direction and 30 um in the Y direction.

* * * * *